(12) United States Patent  
Weiss et al.

(10) Patent No.: US 12,174,224 B2
(45) Date of Patent: Dec. 24, 2024

(54) CURRENT MEASURING DEVICE WITH HALL SENSORS

(71) Applicant: Siemens Aktiengesellschaft, Munich (DE)

(72) Inventors: Roland Weiss, Erlangen (DE); Karl Fleisch, Erlangen (DE); Ingolf Hoffmann, Herzogenaurach (DE); Alexander Itzke, Nuremberg (DE); Anja Schnieders, Erlangen (DE); Abderrahim Chahid, Hemhofen (DE); Florian Zapf, Bayern (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 18/022,029

(22) PCT Filed: Jul. 14, 2021

(86) PCT No.: PCT/EP2021/069640
§ 371 (c)(1),
(2) Date: Feb. 17, 2023

(87) PCT Pub. No.: WO2022/037854
PCT Pub. Date: Feb. 24, 2022

(65) Prior Publication Data
US 2024/0272205 A1    Aug. 15, 2024

(30) Foreign Application Priority Data
Aug. 18, 2020   (EP) .................................. 20191477

(51) Int. Cl.
*G01R 15/20* (2006.01)
*G01R 19/10* (2006.01)

(52) U.S. Cl.
CPC ........... *G01R 15/202* (2013.01); *G01R 19/10* (2013.01)

(58) Field of Classification Search
CPC ............................ G01R 15/202; G01R 19/10
(Continued)

(56) References Cited

U.S. PATENT DOCUMENTS 4,283,643 A * 8/1981 Levin .................... G01R 15/202
                                                              323/368
4,856,345 A * 8/1989 Mochizuki ................ G01F 1/60
                                                              73/861.17
(Continued)

FOREIGN PATENT DOCUMENTS

| CN | 103308075 A | 9/2013 |
| CN | 204528866 U | 8/2015 |

(Continued)

OTHER PUBLICATIONS

Scoville, J. T. et al: "A Low-Cost Multiple Hall Probe Current Transducer"; Review of Scientific Instruments; AIP; Melville; NY; US; Bd. 62,; Nr. 3; 1. März 1991; pp. 755-760; XP000224321; ISSN: 0034-6748; DOI: 10.1063/1.1142080.

(Continued)

*Primary Examiner* — Christopher P McAndrew
(74) *Attorney, Agent, or Firm* — Henry M. Felereisen LLC

(57) ABSTRACT

A current measuring device for generating an output current proportional to a current to be measured includes at least two Hall sensors arranged on a circular path and oriented identically in relation to a center point. The current measuring device includes an adding circuit summing measurement signals of the Hall sensors, a subtracting circuit for eliminating an offset, a voltage-controlled current source, and a current supply with a toroidal coil having a paramagnetic (Continued)

and/or diamagnetic core and a DC/DC converter supplying the Hall sensors. In a method for measuring a current, a current measuring device has an adding circuit for adding the measurement signals of the Hall sensors and generating a voltage proportional to the current to be measured. An offset of the voltage is subtracted by a subtracting circuit, generating an output current with a predefined transformation ratio relative to the measured current.

7 Claims, 3 Drawing Sheets

(58) Field of Classification Search
 USPC .......................................................... 324/114
 See application file for complete search history.

(56) References Cited

U.S. PATENT DOCUMENTS

| 5,017,804 | A | * | 5/1991 | Harnden | ................ | H03K 17/90 |
| | | | | | | 327/564 |
| 5,406,202 | A | | 4/1995 | Mehrgardt et al. | | |
| 9,013,167 | B2 | * | 4/2015 | Antonacci | ............ | G01R 33/072 |
| | | | | | | 323/368 |
| 9,222,992 | B2 | * | 12/2015 | Ausserlechner | ... | G01R 19/0092 |
| 9,696,188 | B2 | * | 7/2017 | Rogers | ...................... | G01F 1/58 |
| 2004/0239207 | A1 | | 12/2004 | Kloepzig et al. | | |
| 2005/0156587 | A1 | | 7/2005 | Yakymyshyn et al. | | |
| 2007/0229050 | A1 | | 10/2007 | Shigeta et al. | | |
| 2014/0369380 | A1 | | 12/2014 | Ausserlechner | | |

FOREIGN PATENT DOCUMENTS

| CN | 104395765 B | 12/2016 |
| CN | 206834784 U | 1/2018 |
| DE | 3901792 A1 | 8/1990 |
| DE | 19914772 A1 | 10/2000 |
| DE | 102014108587 A1 | 12/2014 |
| EP | 0548391 A1 | 6/1993 |
| EP | 2695277 A2 | 2/2014 |
| KR | 20110009910 A | 1/2011 |

OTHER PUBLICATIONS

PCT International Search Report mailed Sep. 11, 2021 corresponding to PCT International Application No. PCT/EP2021/069640 filed Jul. 14, 2021.

* cited by examiner

CURRENT MEASURING DEVICE WITH HALL SENSORS

CROSS-REFERENCES TO RELATED APPLICATIONS

This application is the U.S. National Stage of International Application No. PCT/EP2021/069640, filed Jul. 14, 2021, which designated the United States and has been published as International Publication No. WO 2022/037854 A1 and which claims the priority of European Patent Application, Ser. No. 20/191,477.7, filed Aug. 18, 2020, pursuant to 35 U.S.C. 119 (a)-(d).

BACKGROUND OF THE INVENTION

The invention relates to a current measuring device for generating an output current that is proportional to a current to be measured. The invention further relates to a current converter with a current measuring device of this kind. The invention further relates to a method for measuring a current to be measured with a measuring device of this kind or a current converter of this kind.

Nowadays a plurality of current measuring devices is known. A transformer can be used easily to measure alternating currents. The current which is to be measured and is flowing through the primary winding is transmitted to the secondary side in accordance with the transformation ratio, which corresponds to the ratio of the number of windings. There a current which is correspondingly smaller but is proportional to the current to be measured can then be captured and evaluated by means of a measuring feeder.

Furthermore, a plurality of further measuring methods and arrangements exists, which benefit from the magnetic field generated by the current to be measured. These can be used to measure both alternating current and also direct current. Common to all these arrangements and methods is that they are extremely sensitive to interferences. Electromagnetic fields which occur frequently in large electrical components, such as electrical drives, rank among the interferences, for instance. Electromagnetic influence of the current sensors as a result of high switched currents may occur precisely in a current converter. On the other hand, the regulation of a current converter relies precisely on measured values of current sensors in order to be able to reliably and securely regulate, control and protect the current converter.

Until now a comparatively large amount of space was provided in the current converter for the current measurement. Here the current converters were shielded from the influence of the external field by means of complex magnetic shields, said external field being produced inter alia by the operation of the current converter.

The object underlying the invention is to improve a current measuring device.

SUMMARY OF THE INVENTION

The object is achieved by a current measuring device for generating an output current which is proportional to a current to be measured, wherein the current measuring device comprises at least two Hall sensors arranged on a circular path, wherein the Hall sensors are oriented identically in relation to the center point of the circular path, wherein the current measuring device has an adding circuit for summing measurement signals of the Hall sensors, wherein the current measuring device has a subtracting circuit for eliminating an offset, wherein the current measuring device has a voltage-controlled current source, wherein the current measuring device has a power supply facility with a toroidal coil for supplying the Hall sensors. The invention is further achieved by a current converter having a current measuring device of this kind. Furthermore, the invention is achieved by a method for measuring a current to be measured with a measuring device of this kind or by means of a current converter of this kind, wherein in a first step the measurement signals of the Hall sensors are added by means of the adding circuit and a voltage which is proportional to the current to be measured is generated, wherein in a second step, an offset is subtracted from the voltage which is proportional to the current to be measured by means of the subtracting circuit such that a referenced voltage is produced, in which the voltage which is proportional to the current to be measured is referenced to a predetermined reference mass, wherein in a third step, an output current with a transformation ratio which is predetermined with respect to the current to be measured is generated by means of the voltage-controlled current source as a function of the referenced voltage.

Further advantageous embodiments of the invention are specified in the dependent claims.

The knowledge underlying the invention is that a current sensor can be improved in particular for the use in a current converter such that its Hall sensors for measuring the magnetic field generated by the current are arranged on a circular path, also referred to as circular line. Here the Hall sensors are arranged identically with respect to the center point. In particular, the Hall sensors are oriented tangentially to the circular path with their sensitive axis.

Here the Hall sensors, in combination with the electronic system comprising power supply, adding circuit, subtracting circuit and voltage-controlled current source, form a reliable, interference-insensitive and compact current measuring device. The components can be arranged here in a space-saving manner on a printed circuit board, for instance.

For application in many power electronic systems, but also for use in systems for distributing electrical energy, it is advantageous or necessary for the current sensor to be designed in the form of a current converter. This means that the output signal of the current sensor is a current (known as a secondary current), which behaves in a manner directly proportional to the measuring current (primary current). Since these secondary currents which are generated electronically frequently reach values of 1 A to 5 A, and have to fulfill very high demands in points such as accuracy, frequency response and robustness with respect to external interferences, such as e.g. very high magnetic fields, very high demands are placed on the corresponding electrical or electronic circuit.

One major innovation compared with known current sensors is the use of toroidal coils for the power supply facility for generating the supply voltages of the Hall sensors. It has been shown that generally the Hall sensors are fed with a voltage which differs from the supply voltage which is available for the current measuring device. This voltage required by the Hall sensors is generated with the aid of the power supply facility. It is important that this does not influence the signal to be measured, or the magnetic fields associated with the current to be measured. In this context, the toroidal coil, with which an interfering influence between the current supply and Hall sensors can be avoided or sufficiently suppressed, has a particularly advantageous effect. Furthermore, by combining this power supply facility with the very precise potential-free voltage-controlled current source on an operational amplifier basis with an output stage of type B, an interference-insensitive current measuring device can be specified, which is suited both to measuring direct currents and also to measuring alternating currents according to the current converter principle. By means of the closed flux guiding within the toroid-shaped coil, the mutual influence of the power supply facility and measuring field is eliminated or at least sufficiently minimized. A particularly precise measurement of the current can be achieved, by combining a potential-free, voltage-controlled current source on an operational amplifier basis with a transistor output stage of type B. Since the output stage of type B is not simply arranged in series with the voltage-controlled current source on the OPA basis, but is instead optionally an integral part of the feedback and thus regulation of the OPA, a very precise potential-free voltage-controlled current source is achieved with a very high output bandwidth product and a very good spatial distribution of the power loss. The spatial division of the power loss likewise enables the dimensions of the circular Hall sensors on a printed circuit board to be reduced to a minimal dimension. In this way, sensor circuit boards can be realized, which can be used in a space-saving manner in devices such as for instance a current converter. Customer requirements for increasingly smaller installation sizes are therefore fulfilled.

With the arrangement of the magnetic field sensors, it is decisive that this takes place on a circular line, preferably with a uniform angular division. Moreover, the orientation of the Hall sensors viewed from the center point of the circular line must be uniform. The sensitive axis of the sensors is preferably oriented tangentially to the circular line in order to increase the sensitivity and thus the accuracy of the current measuring device. By way of an analog-electronic adding circuit, the proximity to Ampere's law is formed from the individual signals of the magnetic field sensors and a measurement voltage proportional to the current is thus generated. In the next step, an existing offset is subtracted by means of an analog-electronic subtracting circuit and as a result the measurement signal is referenced to a predetermined reference mass. This signal, the referenced voltage, is then transformed via the already described voltage-controlled current source into an output current, which is proportional to the measuring current, with a fixed transformation ratio with respect to the measuring current. In this way a purely electronically operating current converter is generated without an active magnetic flux circuit. By using the analog circuits, no dead times occur in the system and the current measuring device operates precisely in respect of the current height and without delay, at least approximately without delay, in respect of the measurement signal.

It is particularly advantageous that the proposed current measuring device is suited to measuring direct current and alternating current. Until now, known transformational converters for implementing the current converter principle are only suited to measuring alternating current on account of the magnetic field and saturation effects used there.

This described arrangement and the method are suited in particular as a result of their dimensions and the components used to measuring currents in the order of magnitude of 400 A to 10 kA.

Here the power supply facility comprises a DC/DC converter. By using a DC/DC converter, compared with a linear regulator, the power loss is reduced to approx. 30%, so that heat dissipation problems can be avoided. Moreover, the magnetic components required for a DC/DC converter can be installed in the current measuring device by using the toroidal coil, without impermissibly influencing the magnetic fields of the current to be measured and thus the measurement result. A cost-effective, reliable and precise current measuring device can thus be realized.

Since the overall circuit is exposed to very high magnetic fields and these magnetic fields are as far as possible not to be influenced by the electronic circuit of the power supply facility, it is advantageous to design the coils required for the DC/DC converter as toroidal coils which are wound as uniformly as possible.

Moreover, the toroidal coil has a paramagnetic and/or diamagnetic core. By embodying the toroidal coil with a paramagnetic and/or diamagnetic core, interference fields are further reduced, and the accuracy of the measuring device further increased. By using ferro- or ferrimagnetic core materials, it would however also be possible to sufficiently accurately measure a current, but by using the paramagnetic and/or diamagnetic core, the accuracy of the current measurement can be increased still further. Furthermore, an interference-free operation of the DC/DC converter is possible, which could otherwise be negatively affected on account of saturation effects with ferro- or ferrimagnetic core materials. The use of ferro- or ferrimagnetic core materials firstly therefore enables the interference-free operation of the DC/DC converter. Therefore, by combining ferro- or ferrimagnetic core materials and the DC/DC converter, a particularly reliable, fail-safe and moreover accurate current sensor can be realized.

With an advantageous embodiment of the invention, the current measuring device has at least eight Hall sensors. It has been shown that the use of eight Hall sensors can achieve a particularly good ratio of useful signal to interference signal. These eight Hall sensors are advantageously arranged with an angular division of 45° on the circular line, preferably on a printed circuit board. Even when the current to be measured does not run through the center point of this circular line, with the proposed arrangement it is possible to very accurately determine the current on account of the high number of Hall sensors. The influence of interference variables, for instance as a result of external magnetic fields, is then minimal to such an extent that their influence on the measurement result is compensated by the adding circuit.

BRIEF DESCRIPTION OF THE DRAWING

The invention is described and explained in more detail below using the exemplary embodiments shown in the figures. In the drawings.

DETAILED DESCRIPTION OF PREFERRED EMBODIMENTS

Figure 1:
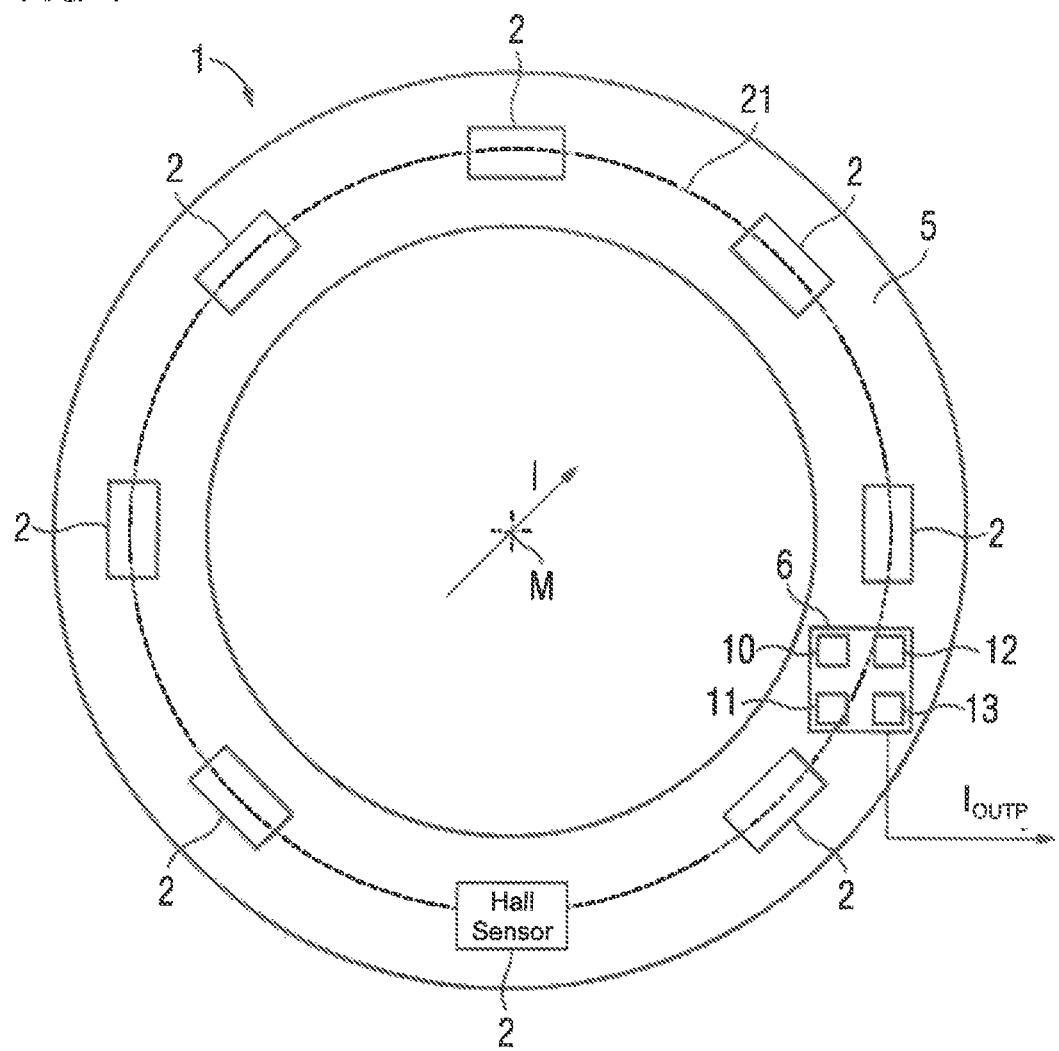
FIG. 1 shows a printed circuit board with eight Hall sensors.

FIG. 1 shows a current measuring device 1. Hall sensors 2 are arranged on a printed circuit board 5 on a circular path 21 about a center point M. In this exemplary embodiment, eight Hall sensors 2 can be used. In order to implement the measuring method by means of the proposed current measuring device, only at least two Hall sensors 2 are required, however. The more Hall sensors 2 are used, the better therefore the measurement result. The quantity of eight has proven here to be a good compromise between a high accuracy and a simple, cost-effective measuring arrangement.

A current I which penetrates the surface bounded by the circular path 21 can therefore be measured. In this exemplary embodiment, the printed circuit board 5 is embodied here as a circular disk, in order to measure the current through a conductor 7, not shown here, about which the printed circuit board 5 can be arranged. In relation to the center point M of the circular path 21, the eight Hall sensors 2 are oriented identically. The orientation of the Hall sensors 2 with their sensitive axis tangentially to the circular path 21 is particularly advantageous.

The eight Hall sensors 2 are distributed here, not necessarily, equidistantly on the circular path 21. This nevertheless enables an accurate measurement of the current I, even when this does not run through the center point M of the circular path 21. The current measuring device 1 makes a current $I_{Outp}$ which is proportional to the current I to be measured available as an output signal. This is generated by the evaluation unit 6, which comprises a power supply facility 10, an adding circuit 11, a subtracting circuit 12 and a voltage-controlled current source 13.

Figure 2:
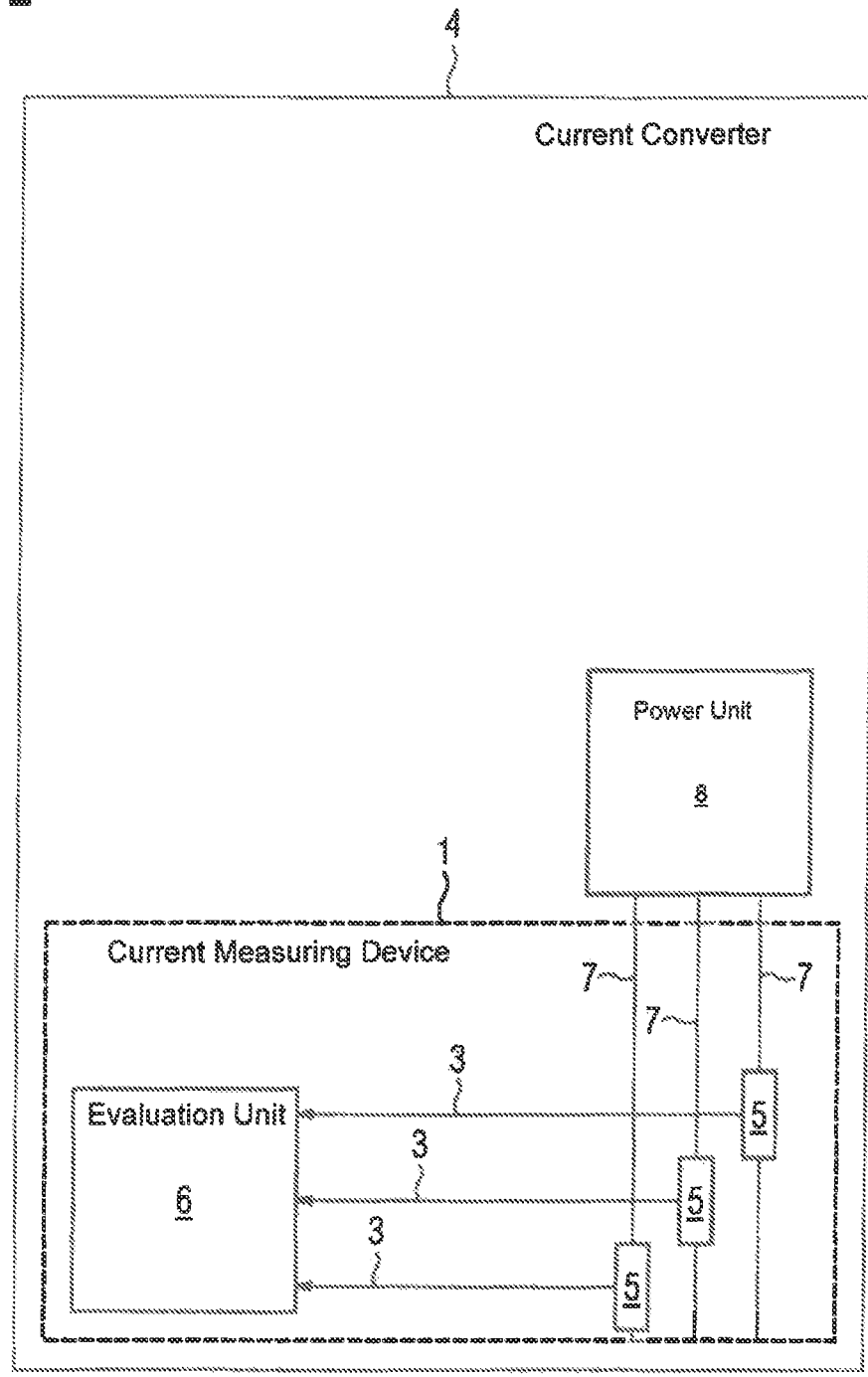
FIG. 2 shows a current converter.

The evaluation unit 6 can be arranged here on the printed circuit board 5 with the Hall sensors or be located outside of the printed circuit board 6. FIG. 2 shows a current converter 4 with a proposed current measuring device 1 for measuring three currents. To this end, three printed circuit boards 5 are arranged around corresponding conductors 7 connected to power unit 8. For reasons of clarity, the representation of the Hall sensors 2 on the printed circuit board 5 was omitted. In this exemplary embodiment, the evaluation unit 6 is located outside of the printed circuit board 5 in the Interior of the current converter 4.

The printed circuit boards 5 are connected in each case to the evaluation unit 6 for transmitting the measurement signals 3 of the Hall sensors 2. Therefore, corresponding current measured values are available with sufficient accuracy in order to regulate and protect the current converter 4. Moreover, the current measuring arrangement 1 is robust to such an extent that it can also be operated in the interior of the current converter 4, in which electrical and/or magnetic interference fields can form, without special shielding measures, in other words unshielded.

Figure 3:
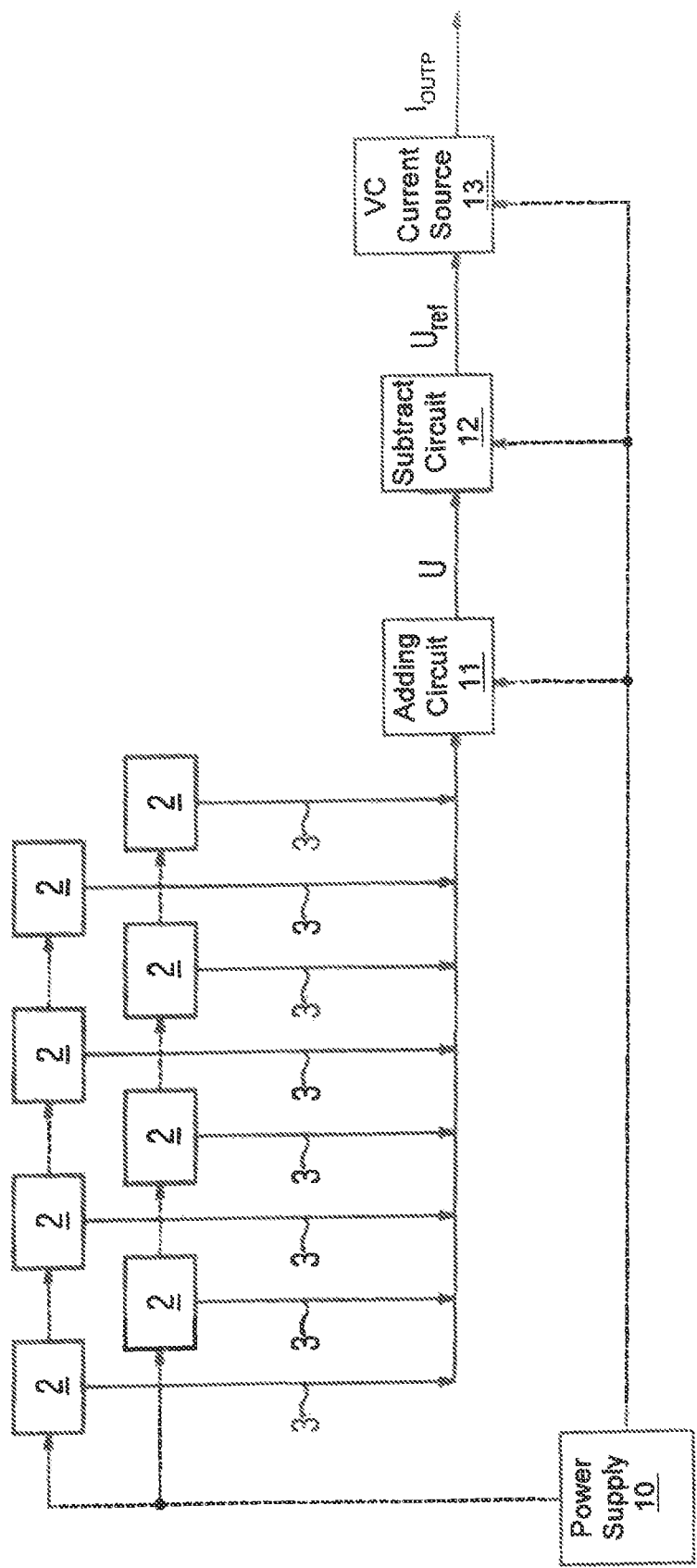
FIG. 3 shows a diagram for implementing the measurement by means of the current measuring device

FIG. 3 shows a diagram of the method for measuring a current I by means of the current measuring device 1. For the avoidance of repetition, reference is made to the description relating to FIGS. 1 and 2 and to the reference characters therein. On the basis of the design of the exemplary embodiment in FIG. 1, eight Hall sensors 2 are also provided here for detecting the current I. These Hall sensors 2 are supplied with electrical energy by a power supply facility 10. The measurement signals 3 of the Hall sensors 2 are supplied to an adding circuit 11. This adds the measurement signals and generates therefrom a voltage U which is proportional to the current to be measured. An offset is subtracted from this voltage U by means of a subtracting circuit 12. The resulting voltage is then related to a predetermined reference mass. This is also referred to as referenced to a reference mass, so that this voltage is referred to as a referenced voltage $U_{ref}$. This is then supplied to a voltage-controlled current source 13, which converts the reference voltage $U_{ref}$ into an output current $I_{Outp}$ which is proportional to the current I to be measured. Here the adding circuit 11, the subtracting circuit 12 and the voltage-controlled current source 13 can also be supplied with electrical energy from the power supply facility 10.

In summary, the invention relates to a current measuring device for generating an output current which is proportional to the current to be measured. In order to improve the current measuring device, it is proposed that the current measuring device comprises at least two Hall sensors arranged on a circular path, wherein the Hall sensors are oriented identically in relation to the center point of the circular path, wherein the current measuring device has an adding circuit for summing measurement signals of the Hall sensors, wherein the current measuring device has a subtracting circuit for eliminating an offset, wherein the current measuring device has a voltage-controlled current source, wherein in order to supply the Hall sensors, the current measuring device has a power supply facility with a toroidal coil, wherein the power supply facility (10) comprises a DC/DC converter, wherein the toroidal coil has a paramagnetic and/or diamagnetic core. The invention further relates to a current converter with a current measuring device of this type. Furthermore, the invention relates to a method for measuring a current to be measured with a current measuring device of this kind or by means of a current converter of this kind, wherein the measurement signals of the Hall sensors are added by means of the adding circuit and a voltage which is proportional to the current to be measured is generated, wherein an offset is subtracted from the voltage which is proportional to the current to be measured by means of the subtracting circuit such that a referenced voltage is produced, in which the voltage which is proportional to the current to be measured is referenced to a predetermined reference mass, wherein an output current is generated with a transformation ratio, which is predetermined with respect to the current to be measured, by means of the voltage-controlled current source as a function of the referenced voltage.

What is claimed is:

1. A current-measuring device for generating an output current that is proportional to a current to be measured, the current measuring device comprising:
   at least two Hall sensors arranged on a circular path and oriented identically in relation to a center point of the circular path;
   an adding circuit configured to sum measurement signals of the at least two Hall sensors;
   a subtracting circuit configured to eliminate an offset from the generated voltage and to produce a reference voltage which is used to reference the voltage with respect to a predetermined reference mass;
   a voltage-controlled current source configured to generate as a function of the reference voltage an output current with a transformation ratio that is predetermined with respect to the current to be measured; and
   a power supply facility comprising a DC/DC converter and a toroidal coil including a paramagnetic or diamagnetic core to supply power to the at least two Hall sensors.

2. The current measuring device of claim 1, wherein the voltage-controlled current source comprises an operational amplifier with a Class B transistor output stage.

3. The current measuring device of claim 1, comprising at least eight Hall sensors.

4. A current converter comprising a current measuring device for generating an output current that is proportional to a current to be measured, said current measuring device comprising at least two Hall sensors arranged on a circular path and oriented identically in relation to a center point of the circular path, an adding circuit configured to sum measurement signals of the at least two Hall sensors, a subtracting circuit configured to eliminate an offset from the generated voltage and to produce a reference voltage which is used to reference the voltage with respect to a predetermined reference mass, a voltage-controlled current source configured to generate as a function of the reference voltage an output current with a transformation ratio that is predetermined with respect to the current to be measured, and a power supply facility comprising a DC/DC converter and a toroidal coil including a paramagnetic or diamagnetic core to supply power to the at least two Hall sensors.

5. The current converter of claim 4, wherein the voltage-controlled current source comprises an operational amplifier with a Class B transistor output stage.

6. The current converter of claim 3, wherein the current measuring device comprises at least eight Hall sensors.

7. A method for measuring a current with a current measuring device comprising at least two Hall sensors arranged on a circular path and oriented identically in relation to a center point of the circular path, the method comprising:
- adding with an adding circuit current measuring signals of the Hall sensors to produce a measured current and generating with the adding circuit a voltage proportional to the current to be measured;
- subtracting with a subtracting circuit an offset from the generated voltage and producing with the subtracting circuit a reference voltage which is used to reference the voltage with respect to a predetermined reference mass; and
- generating with a voltage-controlled current source as a function of the reference voltage an output current with a transformation ratio that is predetermined with respect to the current to be measured.

* * * * *